United States Patent
Uda et al.

[11] Patent Number: 5,994,728
[45] Date of Patent: Nov. 30, 1999

[54] FIELD EFFECT TRANSISTOR AND METHOD FOR PRODUCING THE SAME

[75] Inventors: Tomoya Uda, Takatsuki; Akiyoshi Tamura, Suita, both of Japan

[73] Assignee: Matsushita Electronics Corporation, Osaka, Japan

[21] Appl. No.: 08/748,983

[22] Filed: Nov. 14, 1996

[30] Foreign Application Priority Data

Nov. 15, 1995 [JP] Japan ................................. 7-296750

[51] Int. Cl.⁶ .................................................. H01L 29/72
[52] U.S. Cl. ......................... 257/288; 257/401; 257/217; 257/267
[58] Field of Search ................................ 257/288, 217, 257/267, 401

[56] References Cited

U.S. PATENT DOCUMENTS

| | | |
|---|---|---|
| 4,654,680 | 3/1987 | Yamazaki . |
| 4,721,988 | 1/1988 | Yamazaki . |
| 5,385,857 | 1/1995 | Zaldivar . |

FOREIGN PATENT DOCUMENTS

| | | |
|---|---|---|
| 60-136263 | 7/1985 | Japan . |
| 61-82482 | 4/1986 | Japan . |
| 62-45184 | 2/1987 | Japan . |
| 1-251668 | 10/1989 | Japan . |
| 2-303165 | 12/1990 | Japan . |
| 3-108329 | 5/1991 | Japan . |
| 7-335672 | 12/1995 | Japan . |

*Primary Examiner*—Edward Wojciechowicz
*Attorney, Agent, or Firm*—Michael K. Kelly; Snell & Wilmer

[57] ABSTRACT

A method for producing a field effect transistor includes: a first step of forming an insulating film over a substrate; a second step of dry etching the insulating film to form a rectangular insulating pattern having side surfaces; a third step of forming a gate electrode film over the substrate having the rectangular insulating pattern; a fourth step of conducting substantially anisotropic etching of the gate electrode film to form side walls made of the gate electrode film adjacent to the side surfaces of the rectangular insulating pattern; and a fifth step of removing at least a portion of the insulating pattern to form a side wall gate.

14 Claims, 19 Drawing Sheets

FIG. 1A
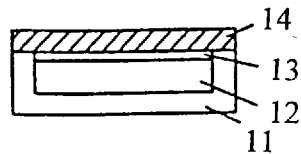
FIG. 1B
FIG. 1B'
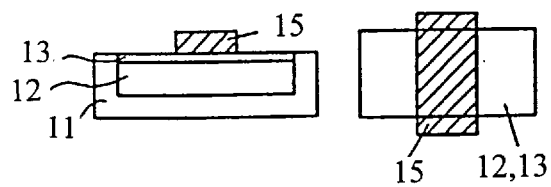
FIG. 1C
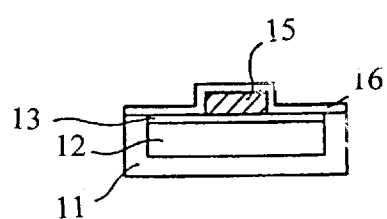
FIG. 1D
FIG. 1D'
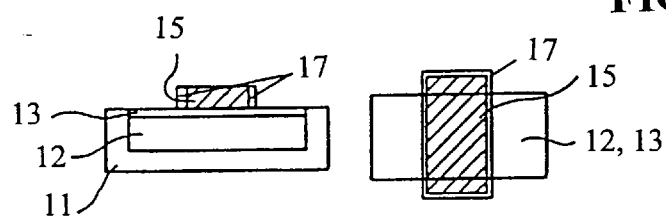
FIG. 1E
FIG. 1E'
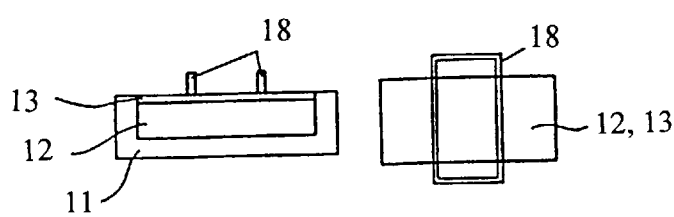
FIG. 1F
FIG. 1F'
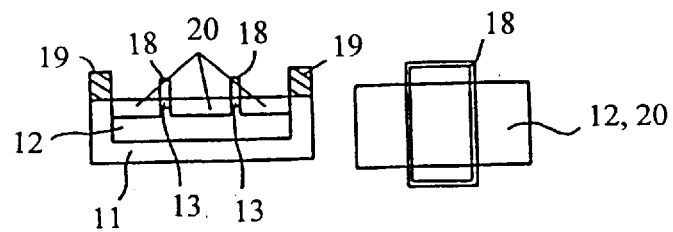

FIG. 1G 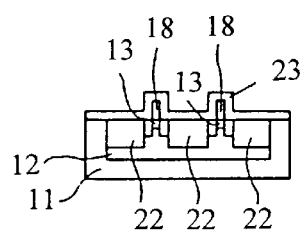 FIG. 1G'  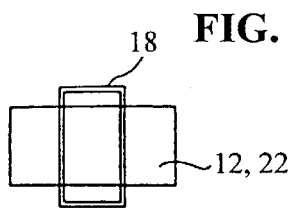
FIG. 1H 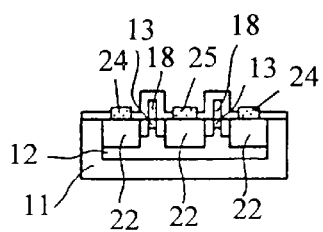 FIG. 1H' 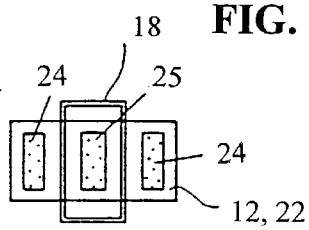
FIG. 1I 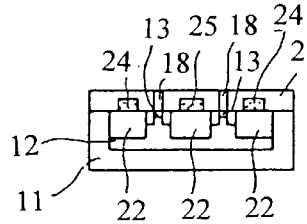 FIG. 1I' 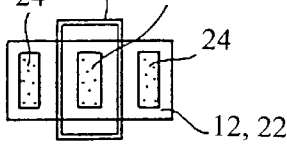
FIG. 1J 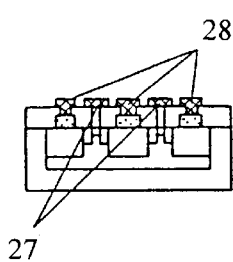 FIG. 1J' 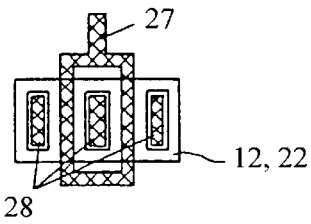
FIG. 1K 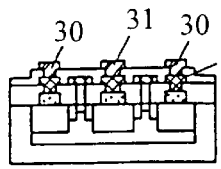 FIG. 1K' 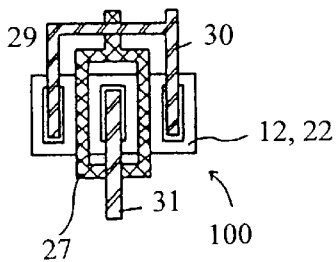
FIG. 1L FIG. 1L'

FIG. 2G
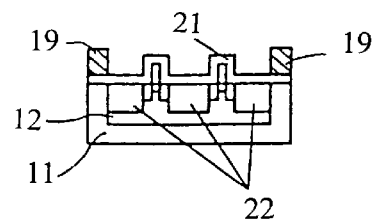
FIG. 2H
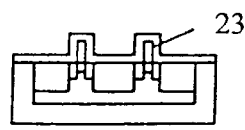
FIG. 2I
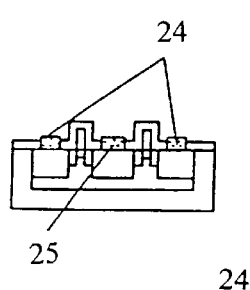
FIG. 2I'
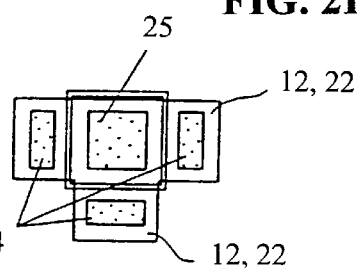
FIG. 2J
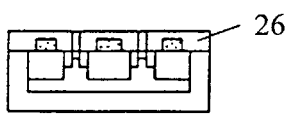
FIG. 2K
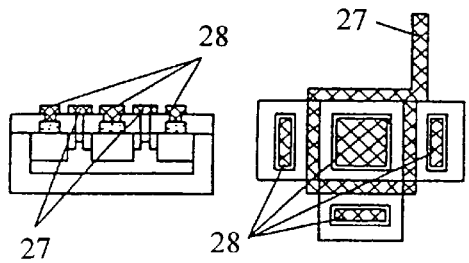
FIG. 2K'
FIG. 2L
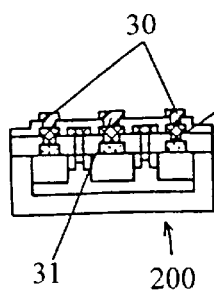
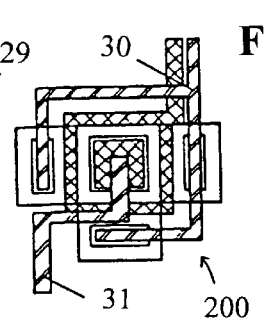
FIG. 2L'

FIG. 5A
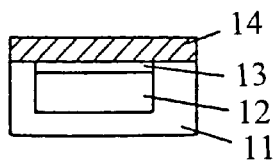
FIG. 5B
FIG. 5B'
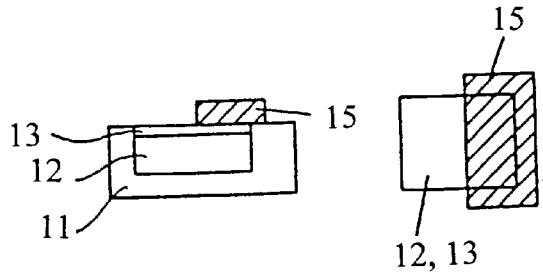
FIG. 5C
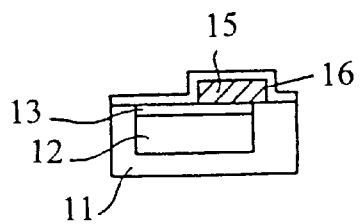
FIG. 5D
FIG. 5D'
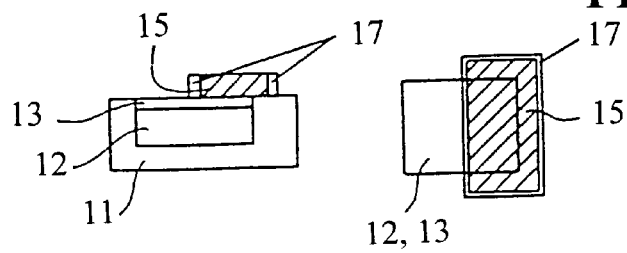
FIG. 5E
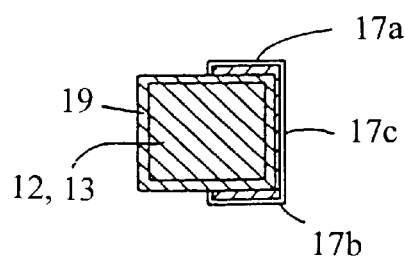
FIG. 5F
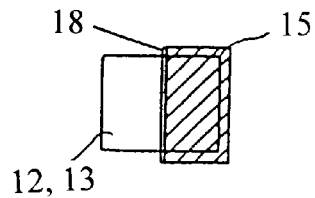

FIG. 5G
FIG. 5G'
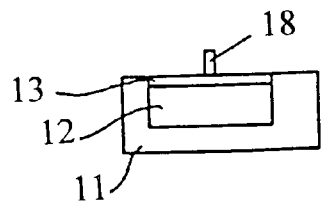
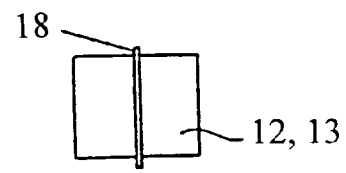
FIG. 5H
FIG. 5H'
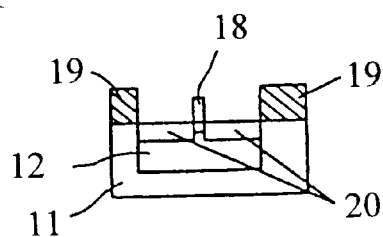
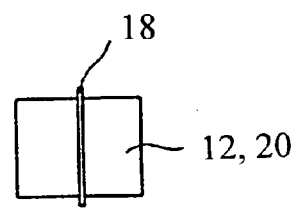
FIG. 5I
FIG. 5I'
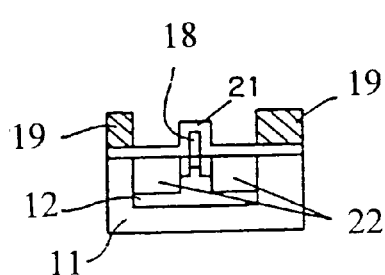
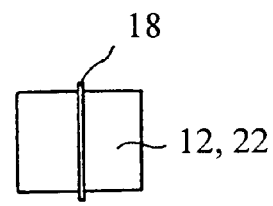
FIG. 5J
FIG. 5J'
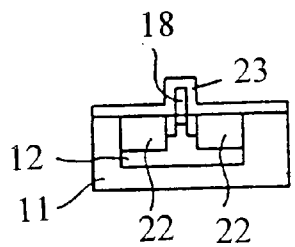
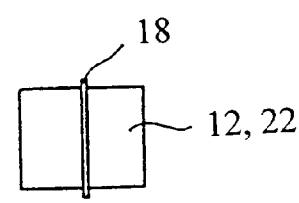
FIG. 5K
FIG. 5K'
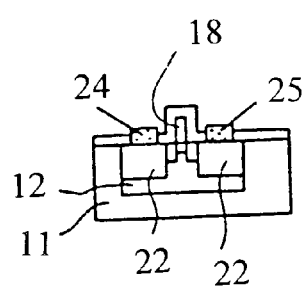
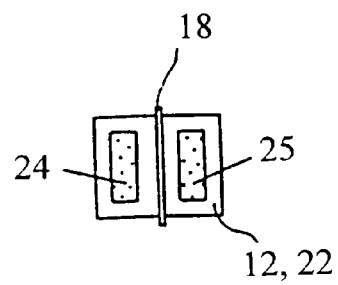

FIG. 6A
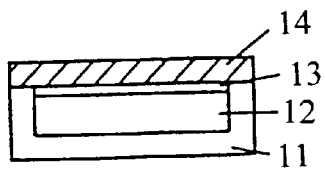
FIG. 6B 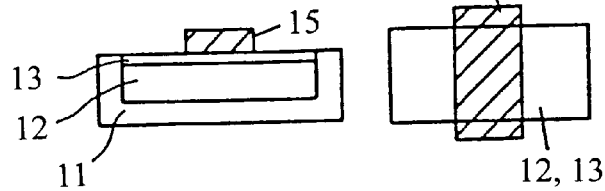 FIG. 6B'
FIG. 6C
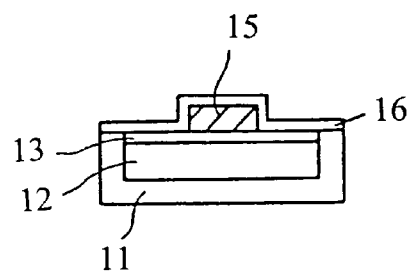
FIG. 6D 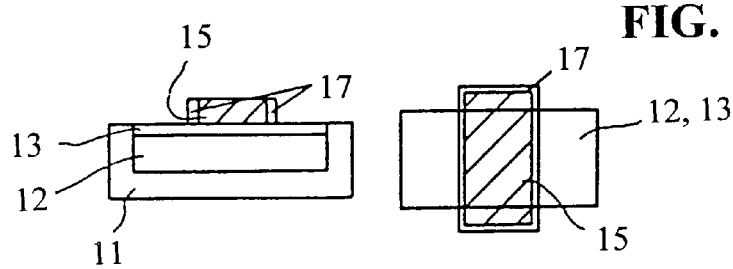 FIG. 6D'
FIG. 6E 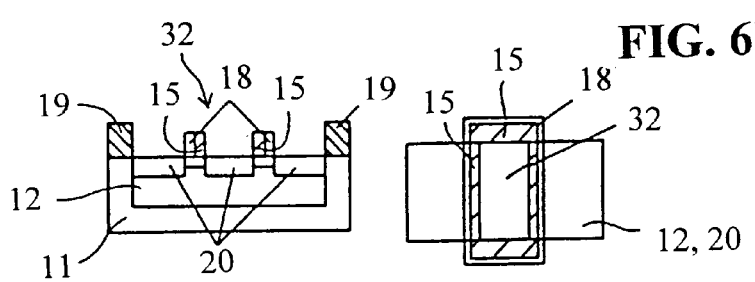 FIG. 6E'
FIG. 6F 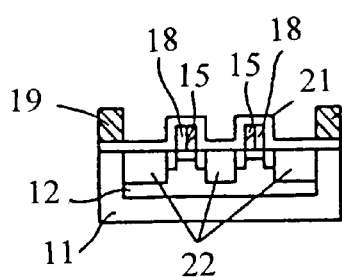 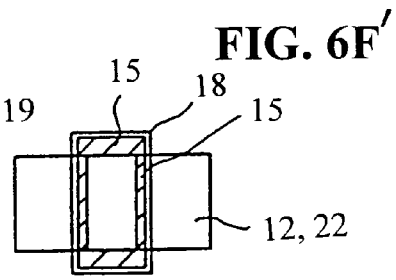 FIG. 6F'

FIELD EFFECT TRANSISTOR AND METHOD FOR PRODUCING THE SAME

BACKGROUND OF THE INVENTION

1. Field of the Invention

The present invention relates to a field effect transistor using compound semiconductors and a method for producing the same. In particular, the present invention relates to a field effect transistor used in a compound semiconductor integrated circuit capable of operating at a high speed which is incorporated in communication apparatuses, computers or the like.

2. Description of the Related Art

In order to operate a field effect transistor (hereinafter, simply referred to as a "FET") using compound semiconductors such as GaAs with a high operation frequency, the gate length needs to be sufficiently short. Photolithography utilizing UV light is not typically suitable for forming a gate having a gate length of 0.5 $\mu$m or less since such a photolithography method has a resolution of 0.4 $\mu$m to 0.5 $\mu$m. Therefore, in general, a photolithography method utilizing an electron beam (hereinafter, simply referred to as an "EB lithography"), which has a higher resolution, is used.

However, EB lithography has the problems of having a high apparatus cost and low throughput.

Thus, methods for producing an FET in which side walls are used to form a gate are proposed, for example, in Japanese Laid-Open Patent Publication No. 60-136263, Japanese Laid-Open Patent Publication No. 61-82482, Japanese Laid-Open Patent Publication No. 62-45184 and Japanese Laid-Open Patent Publication No. 1-251668.

Hereinafter, such a method will be described with reference to FIGS. 8A through 8H.

First, referring to FIG. 8A, a photoresist (not shown) is formed on a substrate 11. Then, a selective ion implantation is conducted using photolithography to form an n region 13 in the surface area of the substrate 11. A portion of the n region 13 will act as a channel region of an FET to be fabricated. Thereafter, an insulating film 14 (e.g., an SiN film) is deposited on the substrate 11 so as to cover the n region 13, for example, by a CVD (chemical vapor deposition) method.

A resist (not shown) having a prescribed pattern is formed on the insulating film 14 by photolithography as an etching mask. Then, as shown in FIG. 8B, the insulating film 14 is subjected to anisotropic dry etching such as RIE (reactive ion etching) using the above etching mask to form an insulating pattern 15 made of the insulating film 14.

Thereafter, as shown in FIG. 8C, a film 16 made of a material capable of being a gate electrode (e.g., WSi) is deposited (hereinafter, simply referred to as a "gate electrode film 16") on the substrate 11 so as to cover the insulating pattern 15.

Then, as shown in FIG. 8D, the gate electrode film 16 is subjected to anisotropic dry etching such as RIE without using an etching mask to remove the portions of the gate electrode film 16 other than the portion adjacent to the outer side surface of the insulating pattern 15. As a result, a side wall 17 made of the gate electrode film 16 is formed adjacent to the side surface of the insulating pattern 15.

As shown in FIG. 8E, the insulating pattern 15 is selectively removed, leaving a side wall gate 18 made of the gate electrode film 16.

Then, as shown in FIG. 8F, a photoresist 19 having a prescribed pattern is formed on the substrate 11 by photolithography. A selective ion implantation is conducted using the photo resist 19 and the side wall gate 18 as a mask to form n+regions 22. The n$^+$regions 22 have an increased dopant concentration and a larger thickness (depth) compared with the n region 13. The positional relationship between the n region 13 and the n$^+$regions 22 is determined in a self-alignment manner using the side wall gate 18 as a mask.

Thereafter, the photo resist 19 is removed. Then, as shown in FIG. 8G, an insulating film 23 made of, for example, $SiO_2$ is deposited on the substrate 11 so as to cover the n$^+$regions 22 and the side wall gate 18. The ion-implanted regions are activated by annealing, using the insulating film 23 as a protection film 23. As a result, active regions of the FET are formed.

Then, as shown in FIG. 8H, a source electrode 24 and a drain electrode 25 are formed on the n$^+$regions (source and drain regions) 22, respectively, via contact holes provided in the insulating film 23. Thereafter, required wirings for the FET are formed, thereby completing the FET.

In the above-described method, photolithography is not used for forming the side wall gate 18 which acts as the gate electrode. The gate length is instead controlled by the thickness of the gate electrode film 16 which will constitute the side wall gate 18. Thus, the resolution of the photolithography has nothing to do with the setting of the gate length.

However, the above-described conventional method for producing FETs in which a side wall is used for forming a gate has the following problems:

First, an FET produced by the above-described method will only have a one-finger type gate electrode (i.e., a gate electrode with only one electrode finger) and FETs having a gate electrode of multi-finger type or dual-gate type are not produced. In the case of one-finger type gate electrodes, the width of the electrode finger needs to be widened to increase the drain current of the FET. As a result, the size of the chip is increased when integrating many such FETs.

Secondly, a portion of the n region 13 which is exposed after the removal of the gate electrode film 16 may be damaged due to the anisotropic dry etching conducted in the step of forming the side wall 17 (see FIG. 8D). If a drain region of an FET consists of such a damaged portion, a gate-drain breakdown voltage may be deteriorated.

SUMMARY OF THE INVENTION

The method for producing a field effect transistor according to the present invention includes: a first step of forming an insulating film over a substrate; a second step of dry etching the insulating film to form a rectangular insulating pattern having side surfaces; a third step of forming a gate electrode film over the substrate having the rectangular insulating pattern; a fourth step of conducting substantially anisotropic etching of the gate electrode film to form a side wall made of the gate electrode film adjacent to the side surfaces of the rectangular insulating pattern; and a fifth step of removing at least a portion of the insulating pattern to form a side wall gate.

In one embodiment, the method further includes a sixth step of forming a plurality of ohmic electrodes, wherein a first type ohmic electrode is formed at a position enclosed by the side wall gate and second type ohmic electrodes are formed at least at a first position and a second position outside the side wall gate, respectively, so as to sandwich the side wall gate. Preferably, the method further includes a sixth step of forming a plurality of ohmic electrodes, wherein a drain electrode is formed at a position enclosed by the side wall gate and source electrodes are formed at least at a first position and a second position outside the side wall gate, respectively, so as to sandwich the side wall gate.

In another embodiment, the fourth step further includes the step of selectively removing portions of the formed side wall along the two opposing side surfaces of the insulating pattern; and the side wall gate formed in the fifth step is of a dual-gate type including a plurality of parallel gate electrodes. Preferably, the method further includes a sixth step of forming a plurality of ohmic electrodes over the substrate, wherein a source electrode and a drain electrode are formed at a first position and a second position, respectively, so as to sandwich the dual-gate type side wall gate.

In still another embodiment, in the first step, the insulating film is formed over a portion of an impurity diffusion region in the substrate to be an active region of the field effect transistor; in the fourth step, the side wall is formed so that one portion thereof overlaps the impurity diffusion region and the other portions thereof are positioned outside the impurity diffusion region; and the fourth step further includes a step of selectively removing the portions of the side wall positioned outside the impurity diffusion region. Preferably, the method further includes a sixth step of forming a plurality of ohmic electrodes, wherein the ohmic electrodes are formed at a first position and a second position, respectively, so as to sandwich the side wall gate. In the second step, the insulating pattern may be formed on a selected portion of the impurity diffusion region to be a drain region, and the method may further include a sixth step of forming a plurality of ohmic electrodes, wherein a source electrode and a drain electrode are formed at a first position and a second position, respectively, so as to sandwich the side wall gate, the drain electrode being formed on the selected portion of the impurity diffusion region. Alternatively, in the fifth step, a portion of the insulating pattern may be selectively removed to form an opening in the insulating pattern, and the method may further include: a sixth step of implanting ions through the opening; and a seventh step of forming a plurality of ohmic electrodes, in which a first type ohmic electrode and a second type ohmic electrode are formed in a first position and a second position, respectively, so as to sandwich the side wall gate, the first type ohmic electrode being formed in the opening. Preferably, in the second step, the insulating pattern is formed on a portion of the impurity diffusion region to be a drain region; and in the fifth step, a portion of the insulating pattern is selectively removed to form an opening in the insulating pattern, and the method further includes: a sixth step of implanting ions through the opening; and a seventh step of forming a plurality of ohmic electrodes, in which a source electrode and a drain electrode are formed in a first position and a second position, respectively, so as to sandwich the side wall gate, the drain electrode being formed in the opening.

In still another embodiment, in the fifth step, a portion of the insulating pattern is selectively removed to form an opening in the insulating pattern, and the method further includes: a sixth step of implanting ions through the opening; and a seventh step of forming a plurality of ohmic electrodes, in which a first type ohmic electrode is formed in the opening and second type ohmic electrodes are formed at a first position and a second position, respectively, which are positioned outside the opening so as to sandwich the side wall gate. Preferably, in the fifth step, a portion of the insulating pattern is selectively removed to form an opening in the insulating pattern, the method further includes: a sixth step of implanting ions through the opening; and a seventh step of forming a plurality of ohmic electrodes, in which a source electrode and a drain electrode are formed at a first position and a second position, respectively, so as to sandwich the side wall gate, the drain electrode being formed in the opening.

According to another aspect of the present invention, the field effect transistor includes a gate wiring having a uniform width of about 0.5 $\mu$m or less which is formed on a substrate including an impurity diffusion region, the gate wiring being formed along four sides of a rectangular region in a closed pattern, at least a portion of the gate wiring acting as a gate electrode.

According to still another aspect of the present invention, the field effect transistor includes: a gate wiring formed on a substrate including an impurity diffusion region, the gate wiring being formed along four sides of a rectangular region in a closed pattern, at least a portion of the gate wiring acting as a gate electrode; a first ohmic electrode formed on the impurity diffusion region inside the gate wiring pattern; and a second ohmic electrode formed on the impurity diffusion region outside the gate wiring pattern.

In one embodiment, a plurality of the second ohmic electrodes are formed at a first position and a second position, respectively, so as to sandwich the gate wiring.

In another embodiment, the impurity diffusion region is formed in a T shape; and a plurality of the second ohmic electrodes are formed at a first position and a second position so as to sandwich the gate wiring, and at a third position which is located in a direction perpendicular to a line across the first and second positions.

In still another embodiment, the impurity diffusion region is formed in a cross shape; and a plurality of the second ohmic electrodes are formed at a first position and a second position so as to sandwich the gate wiring, and at a third position and a fourth position which are located in a direction perpendicular to a line across the first and second positions.

Preferably, the first type ohmic electrode is a drain electrode, and the second type ohmic electrode is a source electrode.

In one embodiment, the field effect transistor further includes an insulator provided inside and adjacent to the closed pattern of the gate wiring.

The gate wiring may have a uniform width of about 0.5 $\mu$m or less.

Preferably, the field effect transistor further includes: a first wiring electrically connected to the first type ohmic electrode; and a second wiring electrically connected to the gate electrode, wherein the first and second wirings are provided at different levels from a surface of the substrate.

According to still another aspect of the present invention, the field effect transistor includes: an ohmic electrode formed on an impurity diffusion region included in a substrate; and a gate wiring formed on the substrate along at least three sides of a rectangular region surrounding the ohmic electrode, at least a portion of the gate wiring functioning as a gate electrode.

In one embodiment, the gate wiring is formed in a closed pattern which encloses the rectangular region surrounding the ohmic electrode.

Preferably, the ohmic electrode is a drain electrode.

In one embodiment, the field effect transistor further includes an insulator provided adjacent to a side of the gate electrode.

The gate electrode may have a uniform width of about 0.5 µm or less.

Preferably, the field effect transistor further includes: a first wiring which is electrically connected to the ohmic electrode; and a second wiring which is electrically connected to the gate electrode, wherein the first and second wirings are provided at different levels from a surface of the substrate.

According to still another aspect of the present invention, the field effect transistor includes: a side wall gate formed on a substrate including an impurity diffusion region to have a uniform width of about 0.5 µm or less; and ohmic electrodes formed at a first position and a second position, respectively, so as to sandwich the side wall gate.

In one embodiment, the side wall gate is of dual-gate type including a pair of parallel gate electrodes.

In another embodiment, the field effect transistor further includes an insulator provided adjacent to a side surface of the side wall gate.

Thus, the invention described herein makes possible the advantages of (1) providing an FET using a multi-finger type or a dual-gate type side wall gate, and (2) providing an FET using a side wall gate having a high gate-drain breakdown voltage by reducing the damage to a drain region caused by etching. The invention described herein also makes possible the advantage of (3) providing a method for producing such a FET.

These and other advantages of the present invention will become apparent to those skilled in the art upon reading and understanding the following detailed description with reference to the accompanying figures.

BRIEF DESCRIPTION OF THE DRAWINGS

FIGS. 1A through 1L are cross-sectional and plan views showing a sequence of steps for producing an FET according to a first example of the present invention;

FIGS. 2A through 2L are cross-sectional and plan views showing a sequence of steps for producing an FET according to a second example of the present invention;

FIGS. 3A through 3L are cross-sectional and plan views showing a sequence of steps for producing an FET according to a third example of the present invention;

FIGS. 6A through 6K are cross-sectional and plan views showing a sequence of steps for producing an FET according to a sixth example of the present invention;

DESCRIPTION OF THE PREFERRED EMBODIMENTS

Figure 2A:
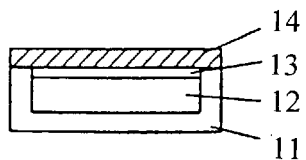
Figure 2A:
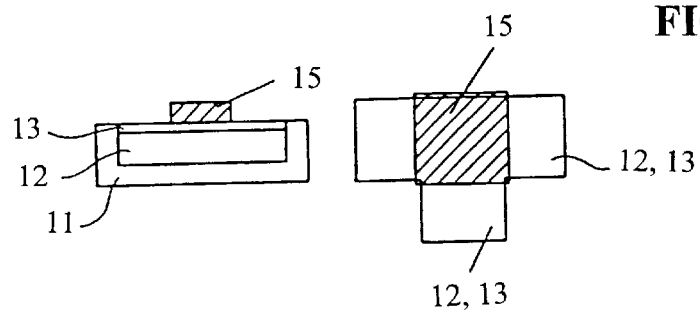
Figure 2C:
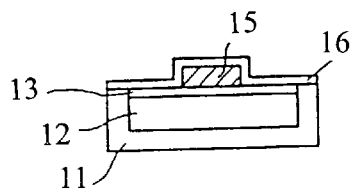
Figure 2C:
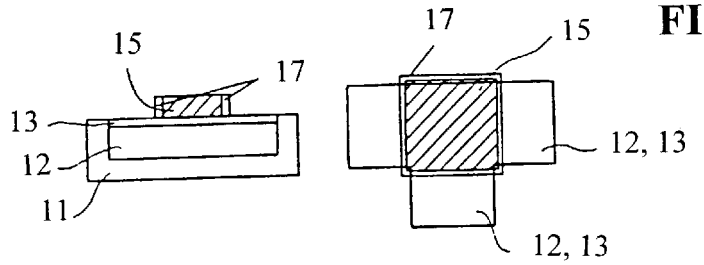
Figure 2C:
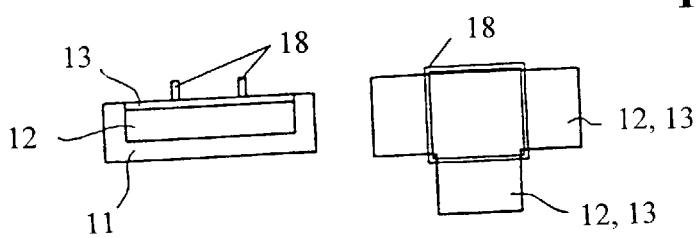
Figure 2F:
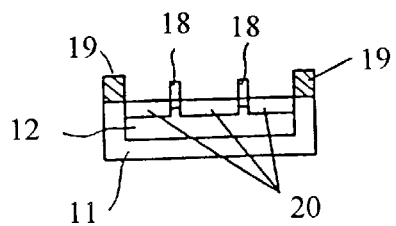

Hereinafter, the present invention will be described by way of illustrative examples with reference to the accompanying drawings.

(EXAMPLE 1)

FIGS. 1A through 1L are cross-sectional and plan views illustrating a sequence of steps for producing an FET 100 according to a first example of the present invention. Each of FIGS. 1B, and 1D through 1L shows a cross-sectional view on the left hand side and a plan view on the right hand side while each of FIGS. 1A and 1C shows only a cross-sectional view.

First, as shown in FIG. 1A, a semi-insulative GaAs substrate 11 is doped with Mg ions using ion implantation at a dose of about $2.0 \times 10^{12}$ cm$^{-2}$ at an acceleration voltage of about 180 keV to form a p region 12 using an appropriately patterned photoresist as a mask. Thereafter, the resultant layers are doped with Si ions using ion implantation at a dose of about $2.0 \times 10^{13}$ cm$^{-2}$ at an acceleration voltage of about 20 keV to form an n region 13 in the surface area of the p region 12. A portion of the n region 13 will act as a channel region of the FET 100. An SiN film 14 having a thickness of about 400 nm is deposited on the substrate 11 as an insulating film so as to cover the n region 13.

As shown in FIG. 1B, a resist (not shown) having an appropriate pattern is then formed on the SiN film 14. Then, the resultant layers are subjected to dry etching (e.g., RIE) using the resist pattern as an etching mask to form a rectangular SiN pattern 15.

Next, as shown in FIG. 1C, a WSi film 16 (which will act as a gate electrode film 16) is deposited on the substrate 11 so as to cover the SiN pattern 15 and have a thickness of approximately 200 nm.

Thereafter, as shown in FIG. 1D, the WSi film 16 is subjected to dry etching (RIE), without using an etching mask, to remove portions of the WSi film 16 other than a portion adjacent to the side surfaces of the SiN pattern 15. As a result, a side wall 17 made of WSi is formed so as to surround all side surfaces of the SiN pattern 15 as seen in the plan view of FIG. 1D.

Succeedingly, as shown in FIG. 1E, the SiN pattern 15 is removed using hydrofluoric acid, leaving a side wall gate 18 along sides of a rectangular region (hereinafter, the side wall gate 18 may also be referred to as the "rectangular side wall gate").

Then, as shown in FIG. 1F, a photoresist 19 having an appropriate pattern is formed on the substrate 11. The resultant layers are doped with Si ions using ion implantation at a dose of about $3.0 \times 10^{12}$ cm$^{-2}$ at an acceleration voltage of about 30 keV using the photoresist 19 as a mask to form n' regions 20.

Referring to FIG. 1G, the photoresist 19 is removed. An SiO$_2$ film (through film) 21 is formed on the substrate 11 so as to cover the n' regions 20. Another resist 19' having an appropriate pattern is formed on the SiO$_2$ film 21. The resultant layers are doped with Si ions using ion implantation at a dose of about $5.0 \times 10^{13}$ cm$^{-2}$ at an acceleration voltage of approximately 150 keV through the SiO$_2$ film 21 to form n$^+$ regions 22 using the side wall gate 18 and the resist 19' as a mask.

Thereafter, the resist 19' and the SiO$_2$ film 21 are removed. Subsequently, as shown in FIG. 1H, an SiO$_2$ film (protection film) 23 is deposited on the substrate 11 so as to cover the n$^+$ regions 22 and the side wall gate 18 with a thickness of about 100 nm. The resultant layers are subjected to annealing at a temperature of approximately 800° C. for 15 minutes to activate the ion-implanted regions.

As shown in FIG. 1I, openings are formed in the SiO$_2$ film 23 above the prescribed portions of the n$^+$ regions 22. Then, ohmic electrodes (source/drain electrodes) 24 and 25 consisting of a multi-layer structure (i.e., AuGe layer/Ni layer/Au layer) are formed in the openings. Preferably, the electrode 25 formed on the n$^+$ region 22 surrounded by the side wall gate 18 functions as a drain electrode, while the electrodes 24 formed on the n⁺ regions 22 outside the side wall gate 18 function as source electrodes. Alternatively, the electrode 25 formed on the n⁺ region 22 surrounded by the side wall gate 18 may function as a source electrode, while the electrodes 24 formed on the n⁺ regions 22 outside the side wall gate 18 may function as drain electrodes.

As shown in FIG. 1J, an SiO₂ film (a first interlayer film) 26 is deposited on the resultant layer so as to cover the side wall gate 18 and the electrodes 24 and 25. Furthermore, a resist (not shown) is formed on the surface of the SiO₂ film 26. The resist is thereafter subjected to baking at a temperature of approximately 180° C. for approximately 5 minutes to flatten the surface thereof. Then, the resist and the first interlayer film 26 are etched back by dry etching (RIE) until the surface of the side wall gate 18 is exposed.

Openings are formed in portions of the first interlayer film 26 above the electrodes 24 and 25. Then, as shown in FIG. 1K, double-layer structures composed of a Ti layer/Au metal layer are formed on the first interlayer film 26 by evaporation and lift off to have a thickness of about 50 nm/300 nm and to have prescribed patterns. The double-layer structures above the electrodes 24 and 25 are formed so as to make contact with the respective electrodes 24 and 25 via the openings, and will act as first level wirings 28. The double-layer structure formed above the side wall gate 18 will act as a metal layer 27 for connection with the gate electrode having a low resistance (hereinafter, simply referred to as a "gate metal layer 27").

Then, as shown in FIG. 1L, an SiN film (a second interlayer film) 29 is deposited so as to cover the gate metal layer 27 and the first level wirings 28. Thereafter, openings are formed in the SiN film 29 so as to reach the first level wirings 28 by dry etching for providing inter-wirings contact. Lastly, second level wirings 30 and 31 made of Ti/Au metal layers are formed by plating so as to be in contact with the first level wirings 28 via the openings.

In this manner, the FET 100 according to the first example of the present invention is produced.

In the case of FET 100, the gate metal layer 27, which is formed at the same level as the first level wirings 28, will act as lead wirings of the side wall gate (gate electrode) 18. The second level wirings 30 and 31 will act as lead wirings of the source/drain electrodes 24 and 25. The metal layer 27 (i.e., the lead wiring of the gate electrode 18) is formed at a level different from that of the second level wirings 30 and 31 with the interlayer insulating film 29 being formed therebetween.

In the first example, as shown in FIGS. 1D and 1E, the side wall gate 18 is formed along the outer side surfaces of the rectangular SiN pattern 15 which is formed so as to cross the n region 13. As shown in FIG. 1I, the ohmic electrode (preferably, a drain electrode) 25 is formed on a portion of the n⁺ region surrounded by the side wall gate 18 and the other ohmic electrodes (preferably, the source electrodes) 24 are formed on portions of the n⁺ regions outside the side wall gate 18. Thus, the FET 100 having a multi-finger type gate electrode can be easily produced using side wall gates.

Conventionally, in the case of a fine gate electrode having a gate length of 0.5 μm or less, the gate electrode is likely to peel off in the succeeding process steps. In the method according to the first example of the present invention, the side wall gate 18 is formed along the sides of a rectangular region in a closed pattern. Therefore, the strength of the side wall gate 18 against forces in the direction parallel to the surface of the substrate 11 is sufficiently high even when the gate length is 0.5 μm or less (i.e., adhesion between the substrate 11 and the side wall gate 18 is sufficiently high).

Alternatively, the side wall gate is not necessarily formed in the closed pattern as described above. When the side wall gate is formed along at least three out of the four sides of the rectangular region, the above-described increased strength may be obtained.

Moreover, a portion of the n⁺ region 22 surrounded by the side wall gate 18 can be protected from plasma damage in the dry etching step of forming the side wall gate 18 (see FIG. 1D). As a result, by using this portion for forming a drain region, a high gate-drain breakdown voltage is obtained.

(EXAMPLE 2)

FIGS. 2A through 2L are cross-sectional views and plan views illustrating a sequence of steps for producing an FET 200 according to a second example of the present invention. In each of FIGS. 2B, 2D, 2E, 2I, 2K and 2L, a cross-sectional view is shown on the left hand side, and a plan view is shown on the right hand side; and in each of FIGS. 2A, 2C, 2F, 2G, 2H and 2J, only a cross-sectional view is shown. Components having like functions and effects are denoted by the same reference numerals as those shown in FIGS. 1A through 1L in the first example.

As shown in FIG. 2A, a p region 12 and an n region 13 are formed in the substrate 11 under the same ion implantation conditions as described in the first example with reference to FIG. 1A. In the second example, the shape of the resist pattern is adjusted such that the p region 12 and the n region 13 form a T shape (see the plan view of FIG. 2B). Then, an SiN film 14 is formed on the substrate 11 so as to cover the n region 13 in a like manner as in the first example.

Thereafter, the FET 200 is completed by following the steps shown in FIGS. 2C through 2L, which are equivalent to the respective steps described in the first example with reference to FIGS. 1C through 1L; and thus the description thereof is omitted.

As shown in FIG. 2D, a side wall gate 18 is formed adjacent to the outer side surfaces of a rectangular SiN pattern 15. Then, as shown in FIG. 2I, an ohmic electrode (preferably, a drain electrode) 25 is provided on an n⁺ region 22 surrounded by the side wall gate 18, while each of the other electrodes (preferably, the source electrodes) 24 is provided on each of n⁺ regions 22 at each of the tips of the T outside the side wall gate 18. Thus, the FET 200 having a multi-finger type gate electrode can be easily produced using the side wall gate.

The FET 200 produced in the second example basically has the same structure and effects as those of the previous FET 100 according to the first example. Since the n region 13 and the p region 12 are formed in a T shape in the second example, three out of four sides of the side wall gate 18 will be used as the gate electrode. As a result, a sufficiently wider gate width is obtained compared with the gate obtained in the first example where only two opposing sides of the side wall gate 18 are used as the gate electrodes. Thus, the drain current is increased in this example.

(EXAMPLE 3)

FIGS. 3A through 3L are cross-sectional and plan views illustrating a sequence of steps for producing an FET 300 according to a third example of the present invention. In each of FIGS. 3B, 3D, 3E, 3I, 3K and 3L, a cross-sectional view is shown on the left hand side and a plan view is shown on the right hand side; in each of FIGS. 3A, 3C, 3F, 3G, 3H and 3J, only a cross-sectional view is shown. Components having like functions and effects are denoted by the same reference numerals as those shown in FIGS. 1A through 1L in the first example.

Figure 3A:
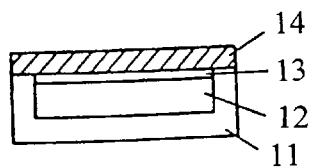
Figure 3B:
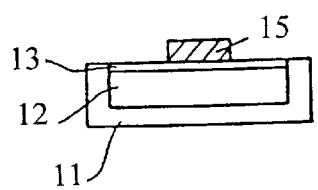
Figure 3B:
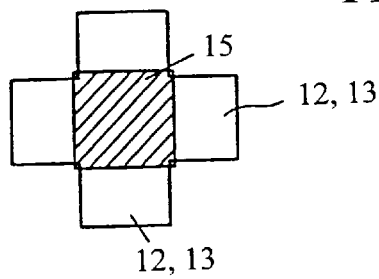
Figure 3C:
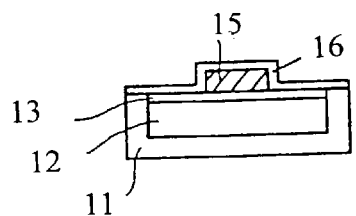

As shown in FIG. 3A, a p region 12 and an n region 13 are formed in the substrate 11 under the same ion implantation conditions as described in the first example with reference to FIG. 1A. According to the third example, the shape of the resist pattern is adjusted such that the n region 13 and the p region 12 form a cross shape. Then, an SiN film 14 is formed on the substrate 11 so as to cover the n region 13 in the like manner as in the first example.

Thereafter, the FET 300 is completed by following the steps shown in FIGS. 3C through 3L which are equivalent to the respective steps described in the first example with reference to FIGS. 1C through 1L; and thus the description thereof is omitted.

Figure 3D:
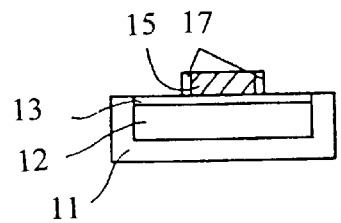
Figure 3D:
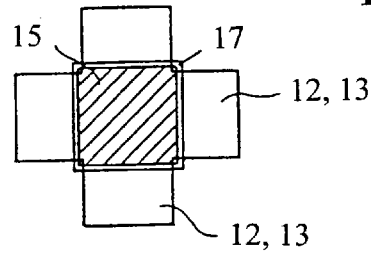
Figure 3E:
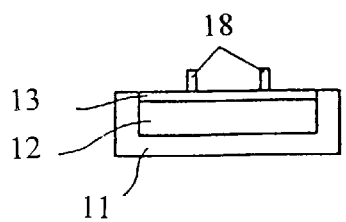
Figure 3E:
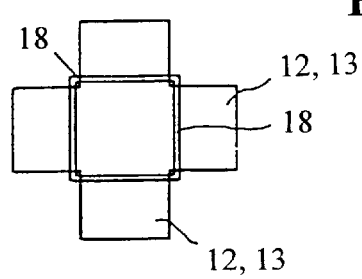
Figure 3F:
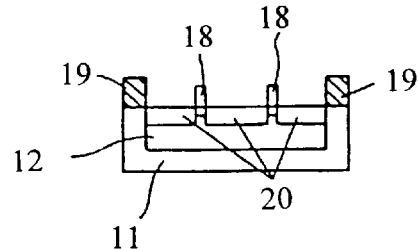
Figure 3G:
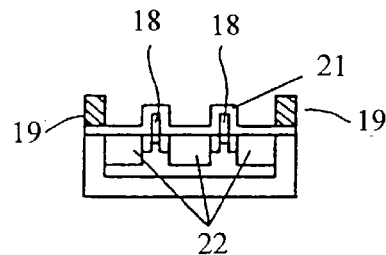
Figure 3H:
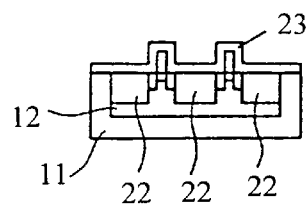
Figure 3H:
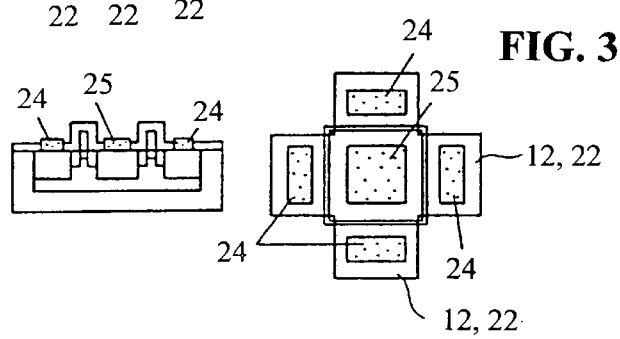
Figure 3J:
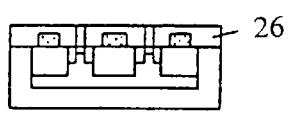
Figure 3J:
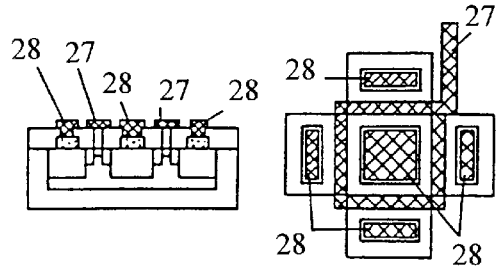
Figure 3J:
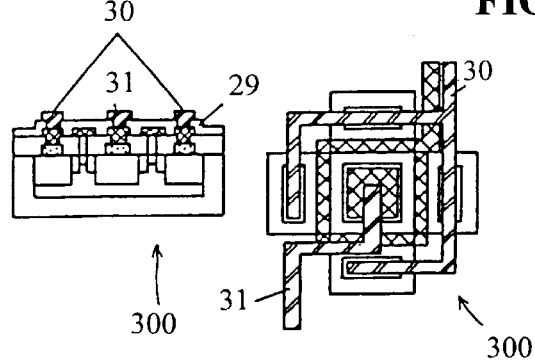

As shown in FIGS. 3D and 3E, a side wall gate 18 is formed adjacent to the outer side surfaces of a rectangular SiN pattern 15. Then, as shown in FIG. 3I, an ohmic electrode (preferably, a drain electrode) 25 is provided on an $n^+$ region 22 surrounded by the side wall gate 18, while each of the other ohmic electrodes (preferably, source electrodes) 24 is provided on each of the $n^+$ regions 22 at each of the tips of the cross outside the side wall gate 18. Thus, the FET 300 having multi-finger type gate electrodes can be easily produced using the side wall gate.

The FET 300 produced by the method according to the third example basically has the same structure and effect as those of the previous FET 100 according to the first example. Since the n region 13 and the p region 12 are formed in a cross shape in the third example, all four sides of the side wall gate 18 will be used as the gate electrode. As a result, a sufficiently wider gate width is obtained compared with the gate obtained in the first example where only two opposing sides of the side wall gate 18 are used as the gate electrode. Thus, the drain current of the FET 300 is increased in this example.

(EXAMPLE 4)

Figure 4A:
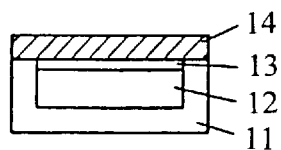
FIGS. 4A through 4N are cross-sectional and plan views showing a sequence of steps for producing an FET according to a fourth example of the present invention.
Figure 4B:
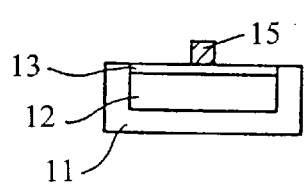
Figure 4B:
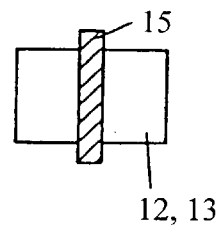
Figure 4C:
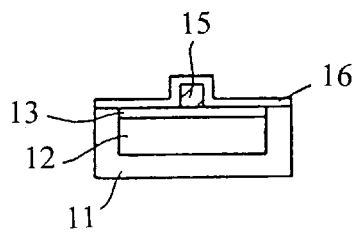
Figure 4D:
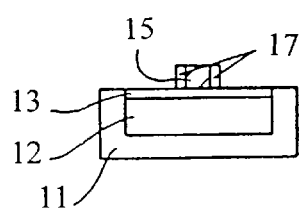
Figure 4D:
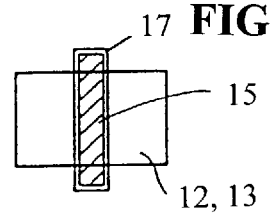
Figure 4E:
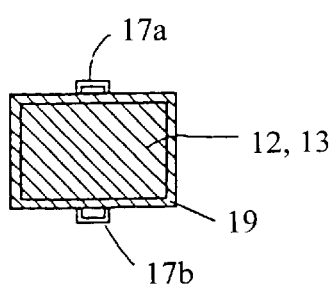
Figure 4F:
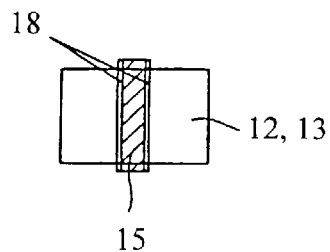
Figure 4G:
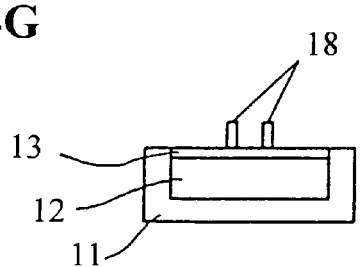
Figure 4G:
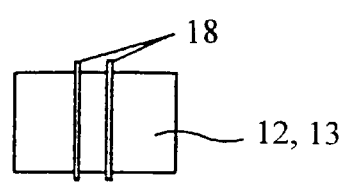
Figure 4H:
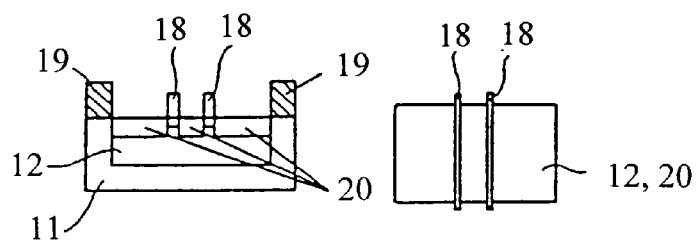
Figure 4H:
Figure 4I:
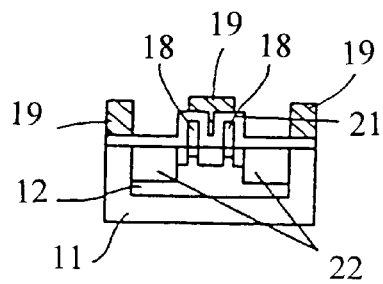
Figure 4I:
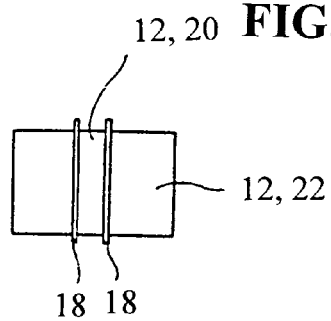
Figure 4J:
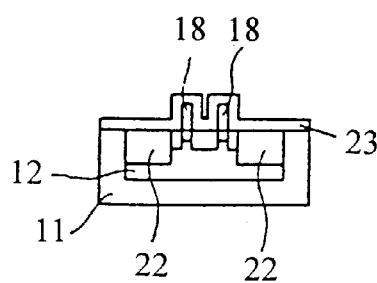
Figure 4J:
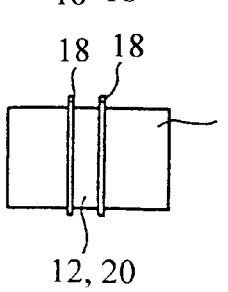
Figure 4K:
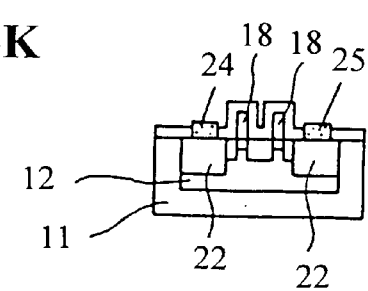
Figure 4K:
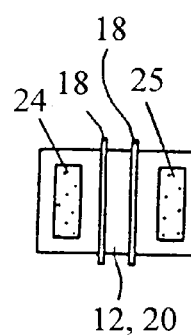
Figure 4L:
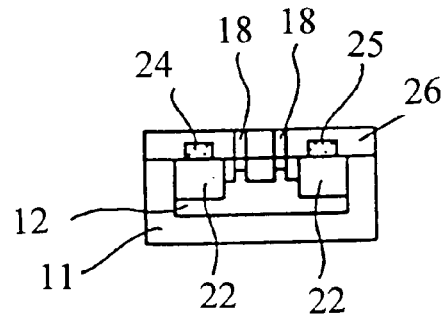
Figure 4L:
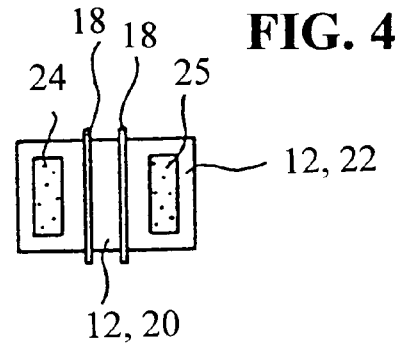
Figure 4M:
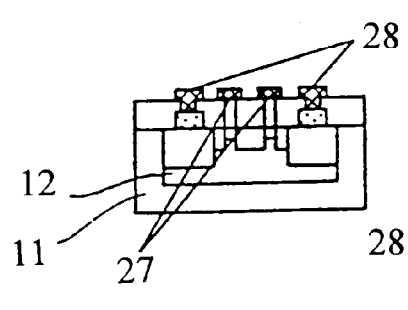
Figure 4M:
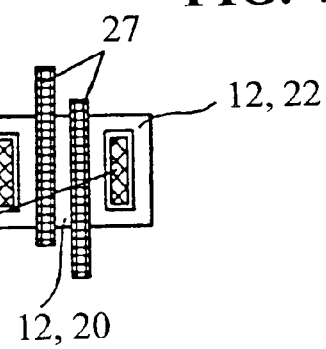
Figure 4N:
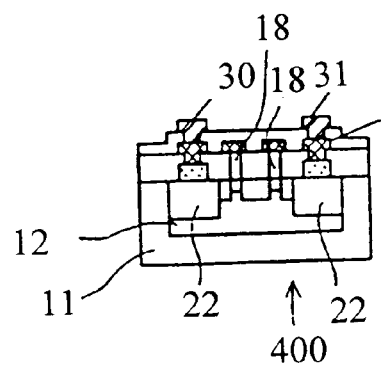
Figure 4N:
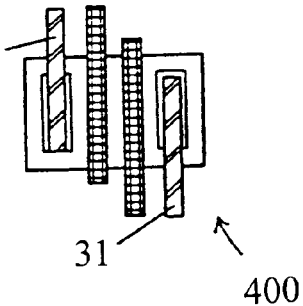

FIGS. 4A through 4N are cross-sectional views and plan views illustrating a sequence of steps for producing an FET 400 according to a fourth example of the present invention. In each of FIGS. 4B, 4D, and 4G through 4N, a cross-sectional view is shown on the left hand side and a plan view is shown on the right hand side; in each of FIGS. 4A and 4C, only a cross-sectional view is shown; and in each of FIGS. 4E and 4F, only a plan view is shown. Components having like functions and effects are denoted by the same reference numerals as those shown in FIGS. 1A through 1L in the first example.

The steps shown in FIGS. 4A through 4D are conducted in the same manner as the respective steps described in the first example with reference to FIGS. 1A through 1D.

Succeedingly, as shown in FIG. 4E, a resist mask 19 is formed so as to cover the n region 13 and not to cover two opposing sides 17a and 17b of the side walls 17 which exist outside the n region 13.

Then, as shown in FIG. 4F, the two opposing sides 17a and 17b of the side walls 17 are selectively removed away by dry etching using the resist mask 19. Thereafter, the resist mask 19 is removed, thereby forming side wall gates 18. The side wall gates 18 according to the fourth example of the present invention will act as a dual-gate type gate electrodes (having two parallel electrode fingers).

Thereafter, the FET 400 is completed by following the steps shown in FIGS. 4G through 4N which are equivalent to the respective steps described in the first example with reference to FIGS. 1E through 1L; and thus the description thereof is omitted.

According to the fourth example, the two opposing sides 17a and 17b of the side walls 17 outside the n region 13 are selectively removed away. As a result, the two parallel side wall gates 18 with equivalent gate lengths and gate widths are formed to be a dual-gate type gate electrode. Moreover, as shown in FIG. 4K, ohmic electrodes (source/drain electrodes) 24 and 25 are separately formed in portions outside of the side wall gate 18. Thus, the dual-gate type FET 400 including two side wall gates can be easily produced.

(EXAMPLE 5)

Figure 5L:
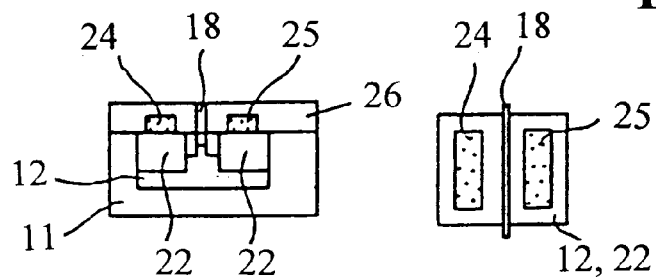
FIGS. 5A through 5N are cross-sectional and plan views showing a sequence of steps for producing an FET according to a fifth example of the present invention.
Figure 5M:
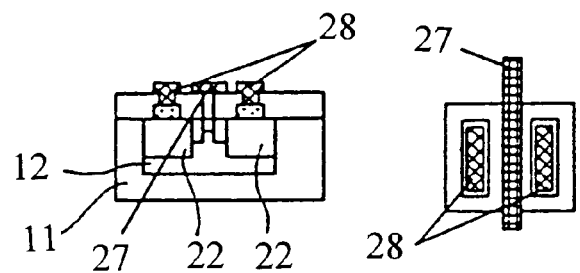
Figure 5N:
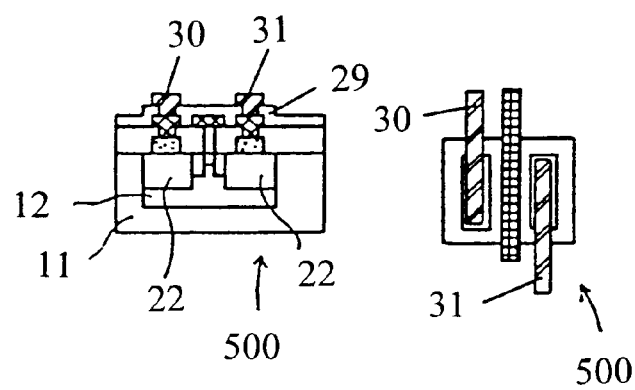

FIGS. 5A through 5N are cross-sectional and plan views illustrating a sequence of steps for producing an FET 500 according to a fifth example of the present invention. In each of FIGS. 5B, 5D, and 5G through 5N, a cross-sectional view is shown on the left hand side and a plan view is shown on the right hand side; in each of FIGS. 5A and 5C, only a cross-sectional view is shown; and in each of FIGS. 5E and 5F, only a plan view is shown. Components having like functions and effects are denoted by the same reference numerals as those shown in FIGS. 4A through 4N in the forth example.

First, as shown in FIG. 5A, a p region 12 and an n region 13 are formed in a substrate 11 under the same ion implantation conditions as described in the first example with reference to FIG. 1A. Then, an SiN film 14 is formed on the substrate 11 so as to cover the n region 13 in the like manner as in the first example. A resist (not shown) having an appropriate pattern is formed on the SiN film 14. Thereafter, as shown in FIG. 5B, the SiN film 14 is subjected to dry etching (RIE) using the resist pattern as a mask to form a rectangular SiN pattern 15. In the fifth example, the SiN pattern 15 is formed so as to be positioned on one side of the n region 13.

Then, as shown in FIG. 5C, a WSi film 16 is deposited on the substrate 11 so as to cover the n region 13 and the SiN pattern 15 and to have a thickness of about 200 nm. The WSi film 16 will act as a gate electrode film 16.

Subsequently, as shown in FIG. 5D, the WSi film 16 is subjected to dry etching (RIE) without using an etching mask, to form a side wall 17 adjacent to the outer side surfaces of the SiN pattern 15 (i.e., the side wall 17 is formed so as to surround the rectangular SiN pattern 15).

Succeedingly, as shown in FIG. 5E, a resist mask 19 is formed so as to cover the n region 13 and not to cover three sides 17a, 17b and 17c of the side walls 17 which are positioned outside the n region 13.

Then, as shown in FIG. 5F, the three sides 17a, 17b and 17c of the side walls 17 are selectively etched away by dry etching using the resist mask 19, leaving a side wall gate 18. Thereafter, the FET 500 is completed by following the steps shown in FIGS. 5G through 5N which are equivalent to the respective steps described in the first example with reference to FIGS. 1E through 1L; and thus the description thereof is omitted. As shown in FIG. 5K, ohmic electrodes (source/drain electrodes) 24 and 25 are formed so as to sandwich the side wall gate 18.

In the fifth example, when a portion of the $n^+$ region 22 covered by the SiN pattern 15 acts as a drain region, the $n^+$ region 22 (to be a drain region later) can be protected from plasma damage caused in the step of forming the side wall gate 18 (see FIG. 5D). As a result, a high gate-drain breakdown voltage is obtained.

(EXAMPLE 6)

FIGS. 6A through 6K are cross-sectional and plan views illustrating a sequence of steps for producing an FET 600 according to a sixth example of the present invention. In each of FIGS. 6B, and 6D through 6K, a cross-sectional view is shown on the left hand side and a plan view is shown on the right hand side; and in each of FIGS. 6A and 6C, only a cross-sectional view is shown. Components having like functions and effects are denoted by the same reference numerals as those in the above-described examples.

First, the steps shown in FIGS. 6A through 6D are conducted which are equivalent to the respective steps described in the first example with reference to FIGS. 1A through 1D.

Figure 6G:
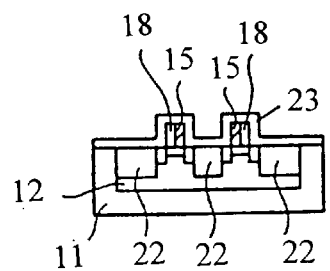
Figure 6G:
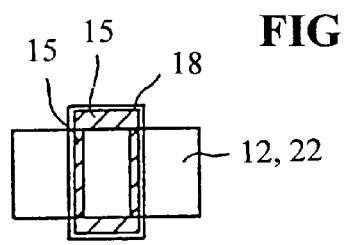
Figure 6H:
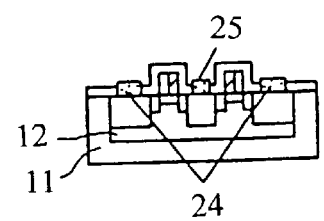
Figure 6H:
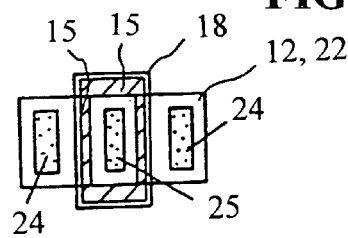
Figure 6I:
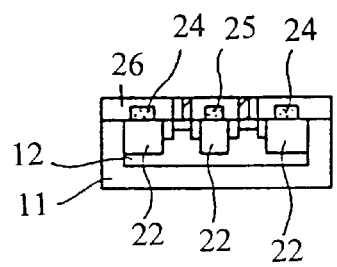
Figure 6I:
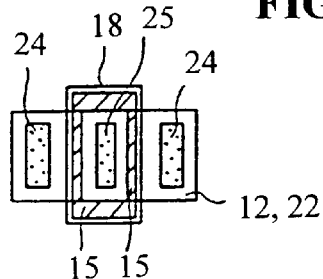
Figure 6J:
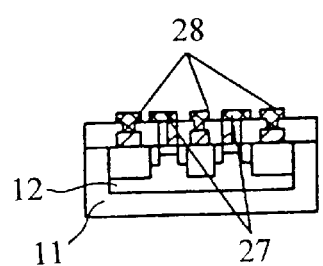
Figure 6J:
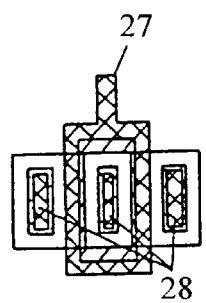
Figure 6K:
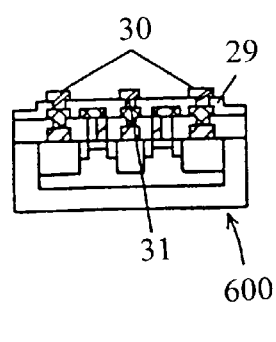
Figure 6K:
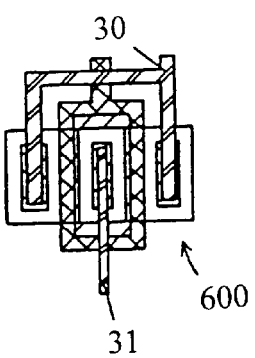

Then, as shown in FIG. 6E, a portion of an SiN pattern 15 is selectively removed away to form an opening 32 by wet etching using a resist having a prescribed shape (not shown) as an etching mask. Subsequently, an n' region 20 is formed under the same ion implantation conditions described in the first example with reference to FIG. 1F. Thereafter, the FET 600 is completed by following the steps shown in FIGS. 6F through 6K which are equivalent to the respective steps described in the first example with reference to FIGS. 1G through 1L; and thus the description thereof is omitted. In the sixth example, an ohmic electrode 25 formed on the n$^+$ region 22 surrounded by the side wall gate 18 preferably functions as a drain electrode, while ohmic electrodes 24 formed on the n$^+$ region 22 outside the side wall gate 18 so as to sandwich the electrode 25 may function as source electrodes. Alternatively, the positional relationship of the source/drain electrodes 24 and 25 may be reversed.

The FET 600 produced in the sixth example basically has the same structure and effects as those of the previous FET 100 according to the first example. Moreover, since the SiN pattern 15 remains inside and adjacent to the side wall gate 18 which is formed along sides of a rectangular region, the strength of the side wall gate 18 against the force in the direction parallel to the surface of the substrate 11 (i.e., adhesion between the substrate 11 and the side wall gate 18) can be sufficiently enhanced.

(EXAMPLE 7)

Figure 7A:
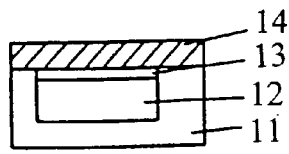
FIGS. 7A through 7N are cross-sectional and plan views showing a sequence of steps for producing an FET according to a seventh example of the present invention.
Figure 7B:
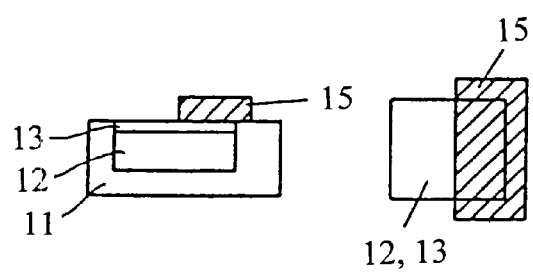
Figure 7B:
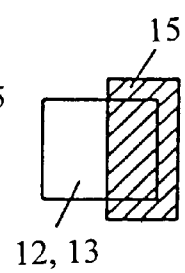
Figure 7C:
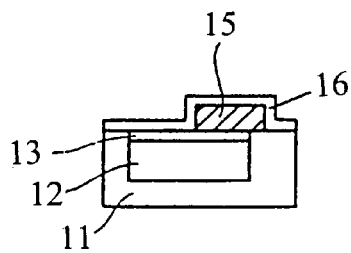
Figure 7D:
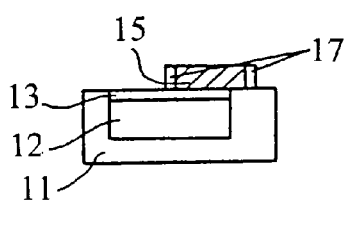
Figure 7D:
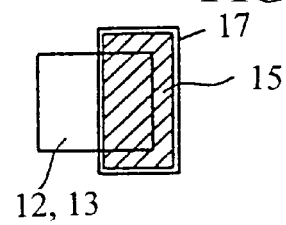
Figure 7E:
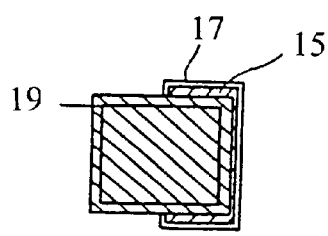
Figure 7F:
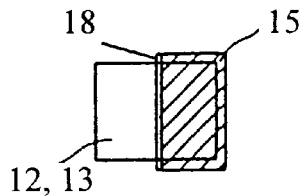
Figure 7G:
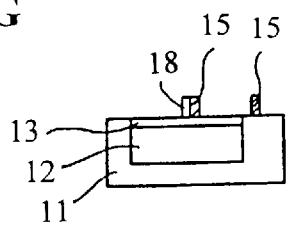
Figure 7G:
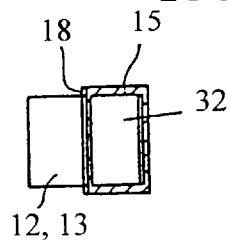
Figure 7H:
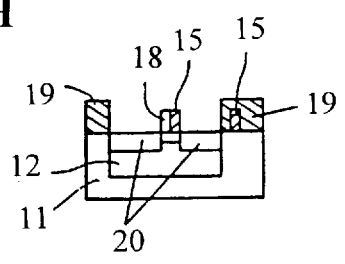
Figure 7H:
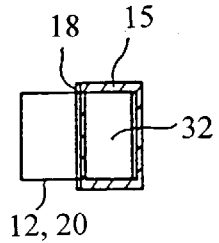
Figure 7I:
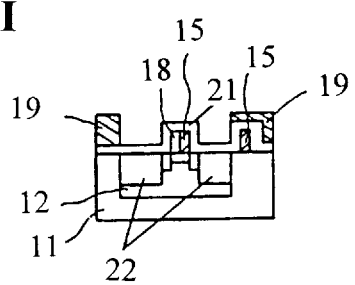
Figure 7I:
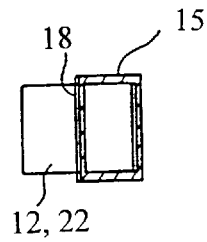
Figure 7J:
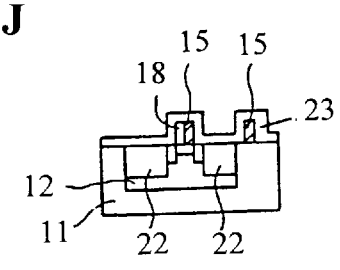
Figure 7J:
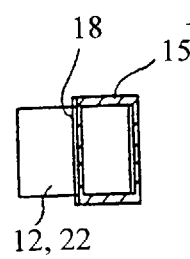
Figure 7K:
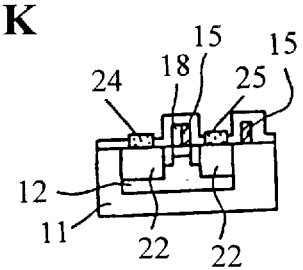
Figure 7K:
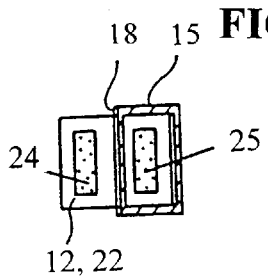
Figure 7L:
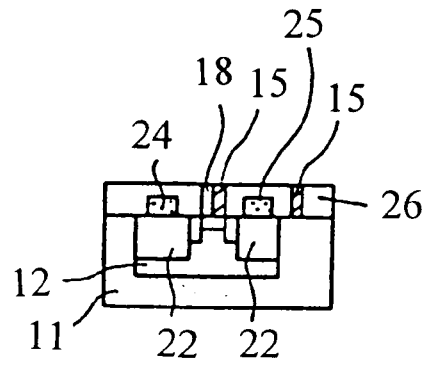
Figure 7L:
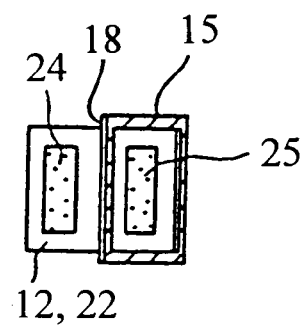
Figure 7M:
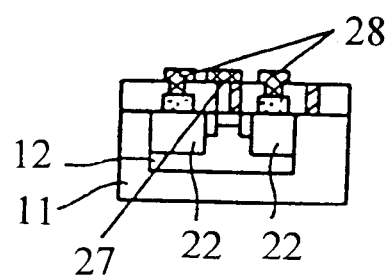
Figure 7M:
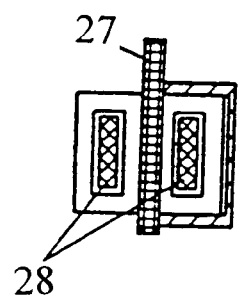
Figure 7N:
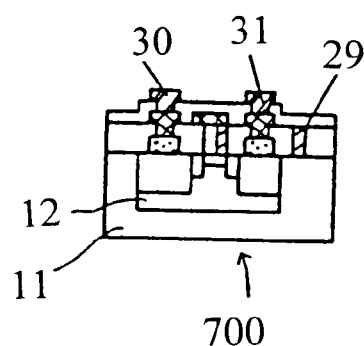
Figure 7N:
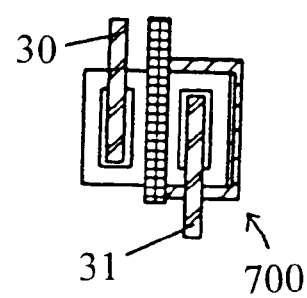
Figure 8A:
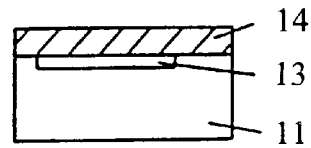
FIGS. 8A through 8H are cross-sectional views showing a sequence of conventional steps for producing an FET.
Figure 8B:
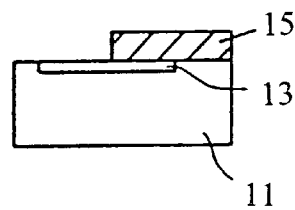
Figure 8C:
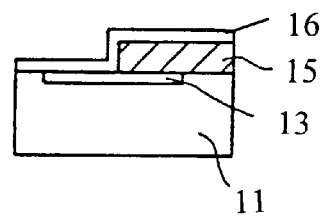
Figure 8D:
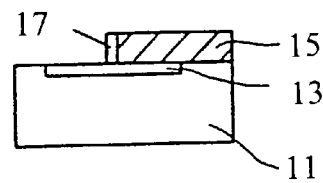
Figure 8E:
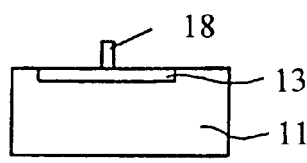
Figure 8F:
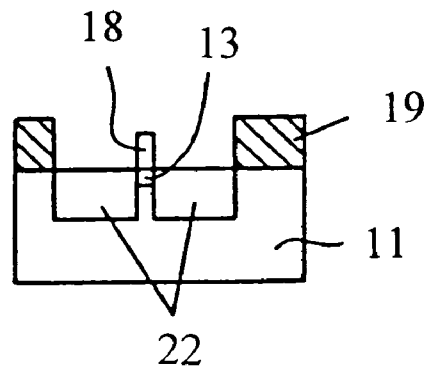
Figure 8G:
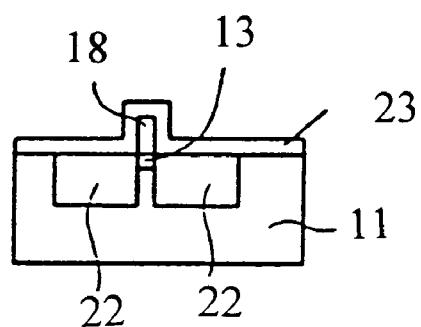
Figure 8H:
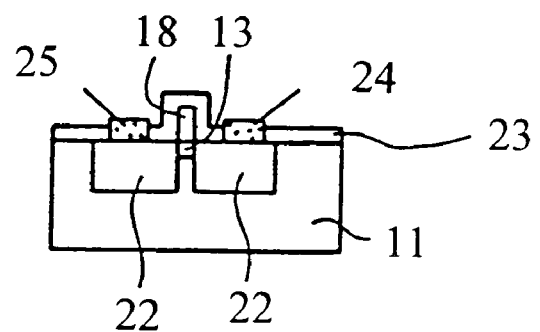

FIGS. 7A through 7N are cross-sectional and plan views illustrating a sequence of steps for producing an FET 700 according to a seventh example of the present invention. In each of FIGS. 7B, 7D, and 7G through 7N, a cross-sectional view is shown on the left hand side and a plan view is shown on the right hand side; in each of FIGS. 7A and 7C, only a cross-sectional view is shown; and in each of FIGS. 7E and 7F, only a plan view is shown. Components having like functions and effects are denoted by the same reference numerals as those in the above-described examples.

First, the steps shown in FIGS. 7A through 7F are conducted which are equivalent to the steps described in the fifth example with reference to FIGS. 5A through 5F.

Then, as shown in FIG. 7G, a portion of the rectangular SiN pattern 15 surrounded by side walls 17 is selectively removed to form an opening 32 by wet etching using a resist having a prescribed pattern (not shown) as an etching mask. Thereafter, the FET 700 is completed by following the steps shown in FIGS. 7H through 7N which are equivalent to those described in the fifth example with reference to FIGS. 5H through 5N; and thus the description thereof is omitted. Ohmic electrodes (source/drain electrodes 24 and 25) are formed so as to sandwich the side wall gate 18.

The FET 700 produced in the seventh example basically has the same structure and effects as those of the previous FET 500 according to the fifth example. Moreover, since the rectangular SiN pattern 15 is formed adjacent to a side surface of the side wall gate 18, the strength of the side wall gate 18 against forces in the direction parallel to the surface of the substrate 11 (i.e., adhesion between the substrate 11 and the side wall gate 18) can be sufficiently enhanced.

As described above, according to a method for producing an FET of the present invention, side walls made of a gate electrode film are formed along side surfaces of a rectangular insulating pattern made of an insulating film. Thus, a side wall gate made of the gate electrode film can be formed along sides of a rectangular region by removing the insulating pattern. The side wall gate is a gate wiring, and at least a portion thereof acts as a gate electrode. Since the side wall gate is formed along the sides of the rectangular region, even when the gate length is about 0.5 $\mu$m or less, an FET having high adhesion between the substrate and the side wall gate can be produced. When the side wall gate (the gate wirings) is formed along at least three of the four sides of a rectangular area, the above-described advantages can be obtained.

Furthermore, by selectively removing the two opposing sides of the side walls, a dual-gate type gate electrode can be formed which consists of two side wall gates having the same gate lengths and the same gate widths.

When an insulating pattern is formed on a substrate so as to cover a portion of an impurity diffusion region (which is to be activated in the later step) to be a drain region later, the drain region to be formed is protected from damage caused by anisotropic etching in the step of forming side walls made of a gate electrode film. Thus, an FET having a high gate-drain breakdown voltage can be easily produced.

An opening can be formed by selectively removing a portion of the insulating pattern such that a rectangular insulative pattern remains inside adjacent to the inner side surfaces of the side wall gate. As a result, even when the side wall gate has a fine gate length of, for example, about 0.5 $\mu$m or less, a strength of the side wall gate against the force in the direction parallel to the surface of the substrate (i.e., adhesion between the substrate and the side wall gate) is increased.

An FET according to the present invention can have a structure in which two opposing fine gate electrodes of the same gate length are formed while being connected with each other. Thus, an FET having a fine multi-finger type gate electrode consisting of two to four electrode fingers can be formed. Specifically, a gate wiring is formed along at least three of the four sides of a rectangular region while at least a portion of the gate wiring will act as an gate electrode. Then, a first type ohmic electrode (preferably, a drain electrode) is formed inside the gate wiring pattern, while a plurality of second type ohmic electrodes (preferably, source electrodes) are formed outside the gate wiring. Thus, an FET having a fine gate electrode of a two-finger, three-finger or four-finger type can be formed depending on the position and the number of the second ohmic electrodes. Since the gate wiring (gate electrode) is formed in a closed pattern so as to enclose the rectangular region, even when the fine side wall gate having a short gate length is formed, the strength of the side wall gate against forces in the direction parallel to the surface of the substrate (i.e., adhesion between the substrate and the side wall gate) is sufficiently high.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A field effect transistor, comprising:
  a gate wiring formed on a substrate including an impurity diffusion region, the gate wiring being formed in a closed rectangular frame pattern, at least two sides of the gate wiring being formed above and electrically coupled tot he impurity diffusion region so as to act as gate electrodes, respectively;
  a first high-concentration impurity diffusion portion formed in the impurity diffusion region inside the gate wiring pattern;
  a second high-concentration impurity diffusion portion formed in the impurity diffusion region outside the gate wiring pattern;
  a first ohmic electrode formed on the first high-concentration impurity diffusion portion; and
  a second ohmic electrode formed on the second high-concentration impurity diffusion portion.

2. A field effect transistor according to claim 1, wherein a plurality of the second ohmic electrodes are formed at a first position and a second position, respectively, on opposite side of the gate wiring.

3. A field effect transistor according to claim 1, wherein the impurity diffusion region is formed in a T shape; and a plurality of the second ohmic electrodes are formed at a first position and a second position on opposite sides of the gate wiring, and at a third position which is located in a direction perpendicular to a line across the first and second positions.

4. A field effect transistor according to claim 1, wherein the impurity diffusion region is formed in a cross shape; and a plurality of the second ohmic electrodes are formed in a first position and a second position on opposite sides of the gate wiring, and at a third position and a fourth position which are located in a direction perpendicular to a line across the first and second positions.

5. A field effect transistor according to claim 1, wherein the first ohmic electrode is a drain electrode, and the second ohmic electrode is a source electrode.

6. A field effect transistor according to claim 1, further comprising an insulator provided inside and adjacent to the closed rectangular frame pattern of the gate wiring.

7. A field effect transistor according to claim 1, wherein the gate wiring has a uniform width of about 0.5 $\mu$m or less.

8. A field effect transistor according to claim 1, further comprising:
  a first wiring electrically connected to the first ohmic electrode; and
  a second wiring electrically connected to the gate electrode, wherein the first and second wirings are provided at different levels from a surface of the substrate.

9. A field effect transistor, comprising:
  a first ohmic electrode formed on a first high-concentration impurity diffusion portion of an impurity diffusion region included ina substrate;
  a gate wiring having three sides disposed in a U-shaped on the substrate so that the first ohmic electrode is positioned inside the U-shape, at least two sides of the gate wiring being electrically coupled to the impurity diffusion region and functioning as gate electrodes, respectively; and
  a second ohmic electrode formed on a second high-concentration impurity diffusion portion of the impurity diffusion region at an opposite side of the gate wiring from the first ohmic electrode.

10. A field effect transistor according to claim 9, wherein the gate wiring is formed in a closed rectangular frame pattern surrounding the first ohmic electrode.

11. A field effect transistor according to claim 9, wherein the first ohmic electrode is a drain electrode.

12. A field effect transistor according to claim 9, further comprising an insulator provided adjacent to a side of the gate electrode.

13. A field effect transistor according to claim 9, wherein the gate electrode has a uniform width of about 0.5 $\mu$m or less.

14. A field effect transistor according to claim 9, further comprising:
  a first wiring which is electrically connected to the first ohmic electrode; and
  a second wiring which is electrically connected to the gate electrode, wherein
  the first and second wirings are provided at different levels from a surface of the substrate.

* * * * *